United States Patent
Ho et al.

(10) Patent No.: US 10,389,923 B2
(45) Date of Patent: Aug. 20, 2019

(54) CAMERA MODULE

(71) Applicant: SAE Magnetics (H.K.) Ltd., Hong Kong (CN)

(72) Inventors: Yiu Sing Ho, Hong Kong (CN); Fen Yan Li, GuangDong (CN); Wen Ju Yang, GuangDong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 0 days.

(21) Appl. No.: 15/665,777

(22) Filed: Aug. 1, 2017

(65) Prior Publication Data

US 2018/0035023 A1 Feb. 1, 2018

(30) Foreign Application Priority Data

Aug. 1, 2016 (CN) .................. 2016 2 0835872 U

(51) Int. Cl.
| | |
|---|---|
| *H04N 5/225* | (2006.01) |
| *H04N 5/374* | (2011.01) |
| *H01L 27/146* | (2006.01) |
| *H02K 41/035* | (2006.01) |

(52) U.S. Cl.
CPC ..... *H04N 5/2253* (2013.01); *H01L 27/14618* (2013.01); *H01L 27/14621* (2013.01); *H01L 27/14627* (2013.01); *H01L 27/14645* (2013.01); *H02K 41/0356* (2013.01); *H04N 5/2252* (2013.01); *H04N 5/2257* (2013.01); *H04N 5/374* (2013.01)

(58) Field of Classification Search
CPC .. H04N 5/2253; H04N 5/2252; H04N 5/2257; H04N 5/374; H01L 27/14618; H01L 27/14621; H01L 27/14645; H02K 41/0356
See application file for complete search history.

(56) References Cited

U.S. PATENT DOCUMENTS

2017/0163856 A1* 6/2017 Wang .................. G02B 7/003

FOREIGN PATENT DOCUMENTS

JP 2004159110 A * 6/2004

OTHER PUBLICATIONS

Machine English Translation, JP 2004-159110 (Jun. 3, 2004) (Year: 2004).*

* cited by examiner

*Primary Examiner* — Nelson D. Hernández Hernández
(74) *Attorney, Agent, or Firm* — Nixon & Vanderhye PC

(57) ABSTRACT

A camera module includes a lens assembly, a voice coil motor assembly for receiving and driving the lens assembly, and an image sensor assembly located below the voice coil motor assembly. The voice coil motor assembly comprises a bottom unit that is hollow and a color filter supported by the bottom unit, the color filter, the lens assembly and the image sensor assembly are coaxial, the bottom unit has an upper portion and a lower portion that are integrated together, the upper portion is configured around the lens assembly, and the bottom unit is configured below the lens assembly and supports the color filter. The camera module has simple structure and convenient assembly, can reduce total assembly tolerances of the camera module, achieve an accurate optical axis alignment between the lens and the image sensor, and reduce manufacturing cost to benefit the popularization in industries.

7 Claims, 6 Drawing Sheets

CAMERA MODULE

This application claims priority to CN Patent Application No. 201620835872.4 filed Aug. 1, 2016, the entire contents of which are hereby incorporated by reference.

FIELD OF THE INVENTION

The present invention relates to camera modules, and in particular, to a camera module with simple structure and convenient assemble.

BACKGROUND OF THE INVENTION

As shown in FIG. 1, a conventional camera module 100 includes a lens assembly 110, a motor assembly 120, a color filter assembly 130 and an image sensor assembly 140. A conventional lens assembly 110 includes a lens barrel 111 and a lens holder 112, multiple lens are stacked in the lens barrel 111, and the lens barrel 111 and the lens holder 112 are connected together by means of screw thread. The motor assembly 120 is commonly a voice coil motor assembly, which includes a base 121, springs, magnet elements, coils and gaskets, etc. The base 121 is located below the lens holder 112 to support it. The color filter assembly 130 is located below the motor assembly 120, and the color filter assembly 130 includes a color filter 131 and a base 132 for supporting this color filter 131, specifically, the filter holder 132 is pressing against the base 121 of the motor assembly 120 to assemble together. The image sensor assembly 140 includes a PCB 142 and a CMOS chip 141 mounted on the PCB 142.

The assembly process of the conventional camera module 100 includes the following steps:

Step 1, mounting the image sensor chip 141 on a PCB 142;

Step 2, mounting the color filter 131 and a filter holder 132 on the PCB 142;

Step 3, joining the bottom 121 of the motor assembly 120 on the filter holder 132;

Step 4, installing the lens assembly 110 in the motor assembly 120.

By this token, during the assembly process of the camera module, a lot of components are to be assembled which cumulates more and more assembly tolerance to degrade the imaging quality of the camera, for example the in-focus position deviates from the image center, and the definition of the image corners are uneven.

Thus it is desired to provide an improved camera module to overcome the drawbacks mentioned above.

SUMMARY OF THE INVENTION

One objective of the present invention is to provide a camera module, which has simple structure and convenient assembly, can reduce total assembly tolerances of the camera module, achieve an accurate optical axis alignment between the lens and the image sensor, and reduce manufacturing cost to benefit the popularization in industries.

To achieve above objective, a camera module includes a lens assembly, a voice coil motor assembly for receiving and driving the lens assembly, and an image sensor assembly located below the voice coil motor assembly. The voice coil motor assembly comprises a bottom unit that is hollow and a color filter supported by the bottom unit, the color filter, the lens assembly and the image sensor assembly are coaxial, the bottom unit has an upper portion and a lower portion that are integrated together, the upper portion is configured around the lens assembly, and the bottom unit is configured below the lens assembly and supports the color filter.

Preferably, the image sensor assembly comprises a PCB and an image sensor mounted on the PCB.

Preferably, the image sensor assembly is surrounded by the lower portion of the bottom unit, and the color filter is located above the image sensor assembly.

Preferably, multiple adjustment legs are provided at a bottom surface, facing to the image sensor assembly, of the bottom unit, and height of the adjustment legs is adjusted to adjust back focal length of the lens assembly.

Preferably, the adjustment legs and the bottom unit is in an integrated structure.

Preferably, four adjustment legs are located at four corners of the bottom surface of the bottom unit.

Preferably, the image sensor assembly is a CMOS chip.

In comparison with the prior arts, since the upper portion and the lower portion of the bottom unit are formed as an integrated structure, the upper portion is for supporting magnet yoke assembly (not shown) of the voice coil assembly, and the lower portion is for supporting color filter and assembled with the image sensor assembly, by comparison with the conventional motor assembly with independent base and independent filter holder, the two portions are integrated together, and structures of the independent base and independent filter holder and their assembly process are omitted. Therefore, total assembly tolerances of the camera module are reduced, an accurate optical axis alignment between the lenses and the image sensor is improved, and furthermore the manufacturing cost is reduced to benefit the popularization in industries.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
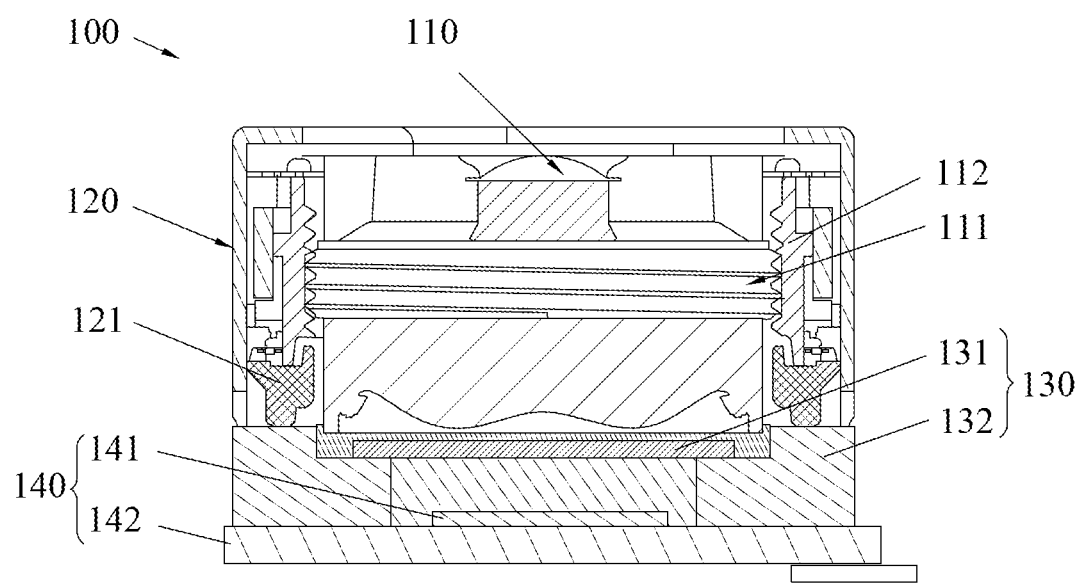
FIG. 1 is a cross-sectional view of a conventional camera module.

Various preferred embodiments of the invention will now be described with reference to the figures, wherein like reference numerals designate similar parts throughout the various views. As indicated above, the invention is directed to a camera module, which has simple structure and convenient assembly, reduce total assembly tolerances of the camera module, achieve an accurate optical axis alignment between the lens and the image sensor, and reduce manufacturing cost to benefit the popularization in industries.

Figure 2:
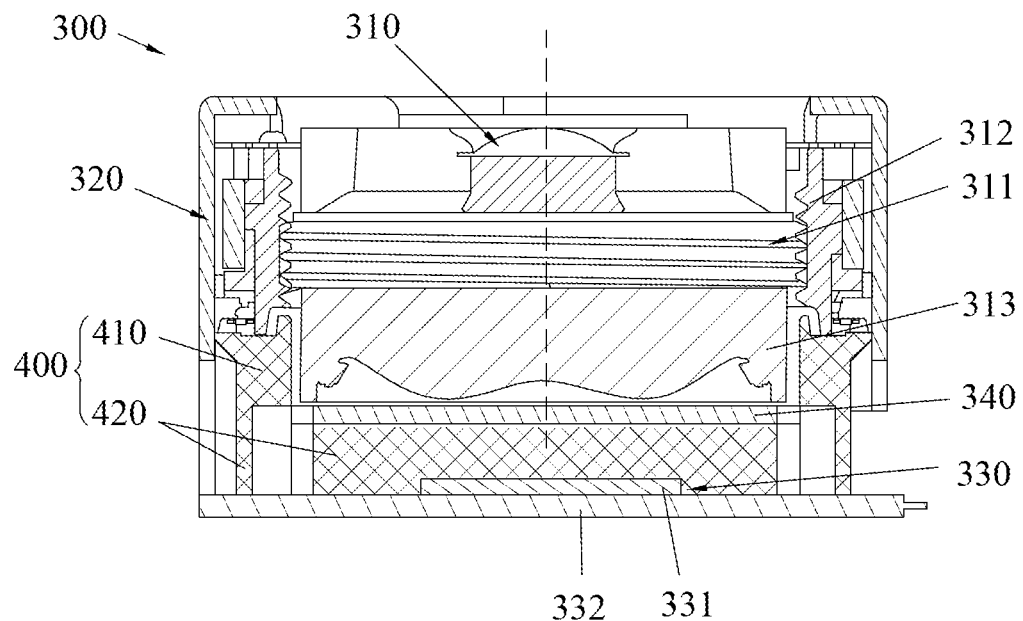
FIG. 2 is a cross-sectional view of a camera module according to one embodiment of the present invention.

Referring to FIG. 2, a camera module 300 according to one embodiment of the present invention includes a lens assembly 310, a voice coil motor assembly 320 and an image sensor assembly 330. Specifically, the lens assembly 310 includes a lens holder 311, a lens barrel 312 and lenses 313 stacked in the lens barrel 312, and the lens barrel 312 is mounted in and held by the lens holder 311. For example, the lens barrel 312 and the lens holder 311 are connected together by means of screw thread, or formed as an integrated structure. In this embodiment, each component of the lens assembly 310 and connections may be consistent with the conventional one, which is omitted here. Specifically, the lens assembly 310 is installed in the voice coil assembly 320 along an optical axis direction, and the image sensor assembly 330 is located below the lens assembly 310 and assembled with the lens assembly 310. The voice coil motor assembly 320 includes a bottom unit 400 located at the lowest position, springs, magnetic elements, coils and gaskets (not shown in detail), the detailed structures and the assembly process of these elements are well known, and thus which are omitted here. Except for the bottom unit 400, structures of other components and assembly structure are similar to the conventional ones, which are not described in detail. Detailed structure of the bottom unit 400 follows thereinafter.

Figure 3:
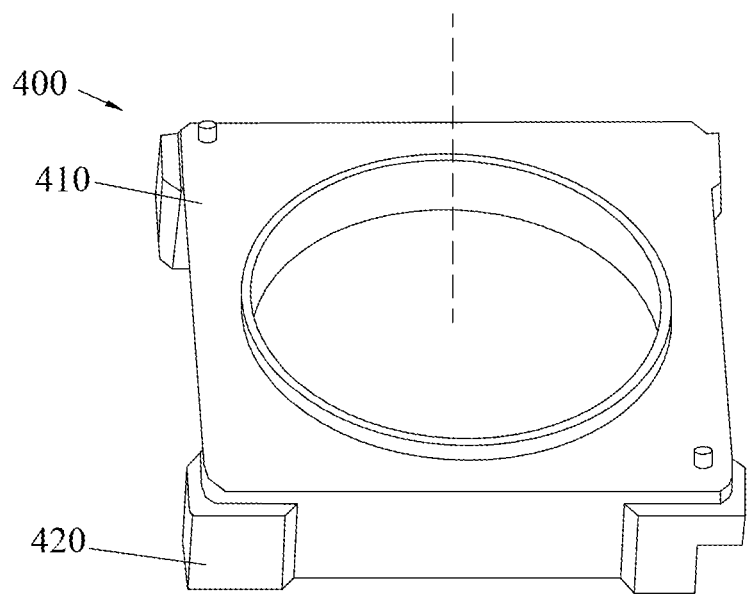
FIG. 3 is a perspective view of a bottom unit of the camera module according to an embodiment of the present invention.

As shown in FIGS. 2 and 3, the bottom unit 400 is located at the lowest position of the voice coil motor assembly 320, and assembled together with the image sensor assembly 330. The bottom unit 400 is a hollow structure, and a color filter 340 is supported on the bottom unit 400 to filter the light entering the CMOS. The bottom unit 400 includes an upper portion 410 and a lower portion 420, and a frame structure is defined by the upper portion 410 and the bottom portion 420. Specifically, the upper portion 410 is configured around the lenses of the lens assembly 310, while the lower portion 420 is configured below the lens assembly 310. The color filter 340 is fixed on the lower portion 420 of the bottom unit 400. For example, an engaging groove (not shown) is formed on the lower portion 420, and the color filter 340 is fixed on the lower portion 420 by the engaging groove.

The image sensor assembly 330 includes an image sensor 331 and a PCB 332, specifically, the image sensor 331 can be a CMOS chip which is mounted on the PCB 332. The color filter 340 is located between the lens assembly 310 and the lower portion 420 of the bottom unit 400, that is, the color filter 340 is supported by the lower portion 420 and covered on the CMOS chip 331, and the color filter 340, the lens assembly 310 and the CMOS chip 331 are coaxial and aligned. The further structures of the CMOS chip 331 and the related components are well known to the persons skilled in the art, which are omitted here.

Since the upper portion 410 and the lower portion 420 of the bottom unit 400 are formed as an integrated structure, the upper portion 410 is for supporting magnet yoke assembly (not shown) of the voice coil assembly 320, and the lower portion 420 is for supporting color filter and assembled with the image sensor assembly, by comparison with the conventional motor assembly with independent base and independent filter holder, the two portions are integrated together, and structures of the independent base and independent filter holder and their assembly process are omitted. Therefore, total assembly tolerances of the camera module are reduced, an accurate optical axis alignment between the lenses and the image sensor is improved, and furthermore the manufacturing cost is reduced to benefit the popularization in industries.

Figure 4:
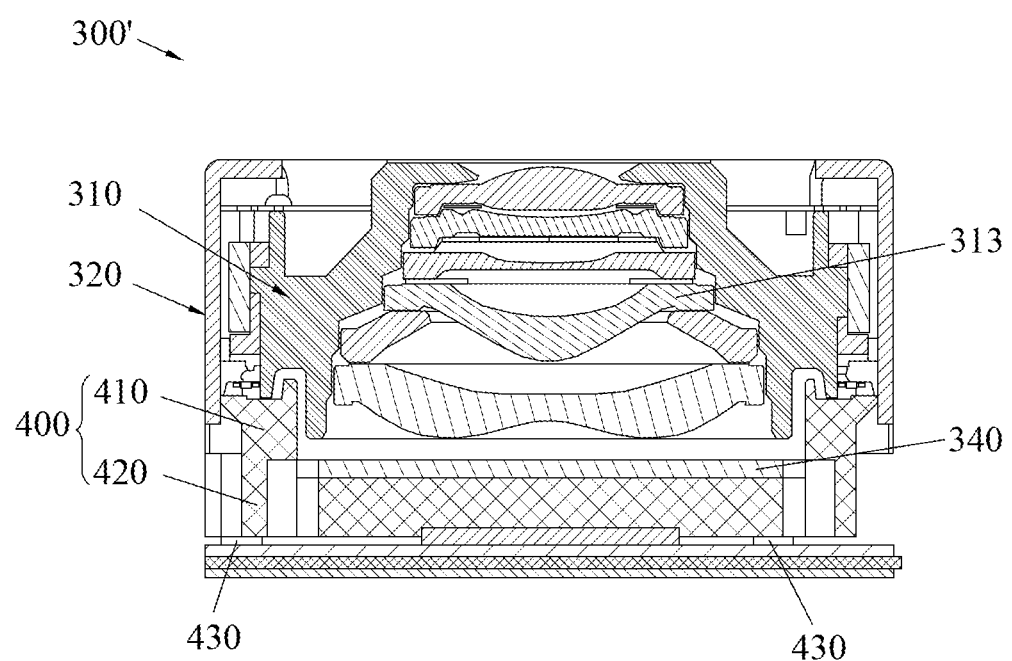
FIG. 4 is a cross-sectional view of a camera module according to another embodiment of the present invention.

FIGS. 4 and 5 show a camera module 300' according to another embodiment of the present invention. Differing from the above embodiment, the lens barrel and the lens holder of the lens assembly 310 are formed in integrated structure, instead of connected by means of screw thread. Several multiple adjustment legs 430 are provided at the bottom surface of the bottom unit 400 that is facing to the image sensor assembly 330, and the height of the adjustment legs 430 can be adjusted to adjust back focal length of the lens assembly 310. Specifically, four adjustment legs 430 are located at four corners of the bottom surface of the bottom unit 400, preferably, they are located at four corners of the bottom surface of the lower portion 420. In this embodiment, the adjustment legs 430 are protruded to form convex cylinders. Preferably, the adjustment legs 430 and the bottom unit 400 are made of plastic materials. As mentioned above, the adjustment legs 430 are for adjusting the back focal length of the lens assembly 310. Specifically, the thickness of the bottom unit 400 and the height of the adjustment legs 430 can be set in a predetermined range according to a test result during the manufacturing. Before the camera module 330 is assembled, the relative position between the lenses 313 and the CMOS chip 331 must be adjusted accurately, thereby maintaining an accurate back focus length.

Figure 5A:
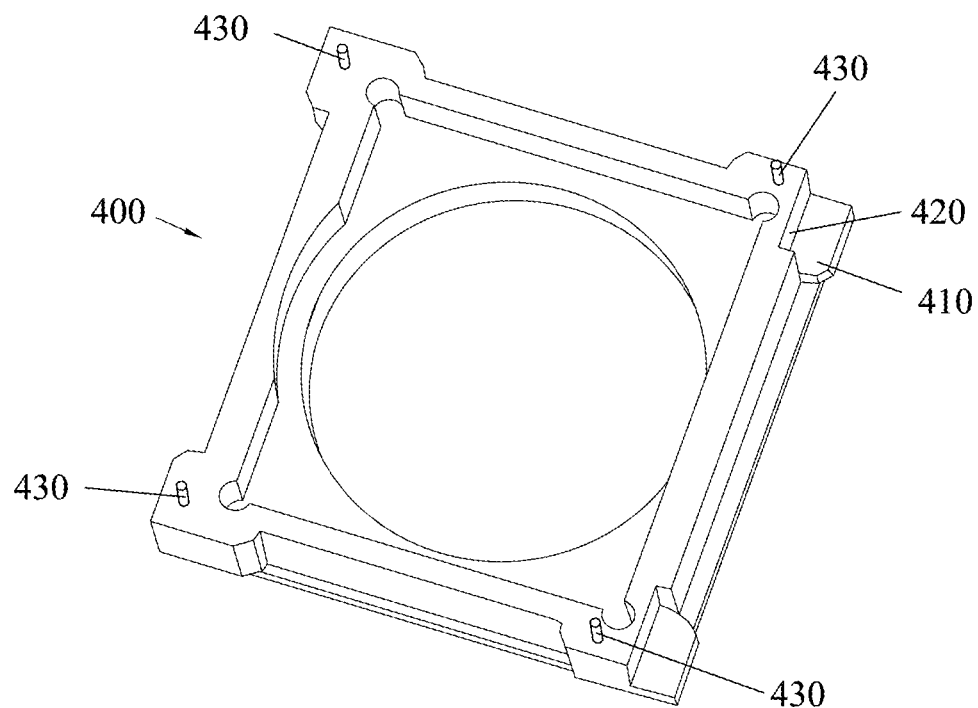
FIG. 5a is a perspective view of the bottom unit of the camera module before hot pressing.
Figure 5B:
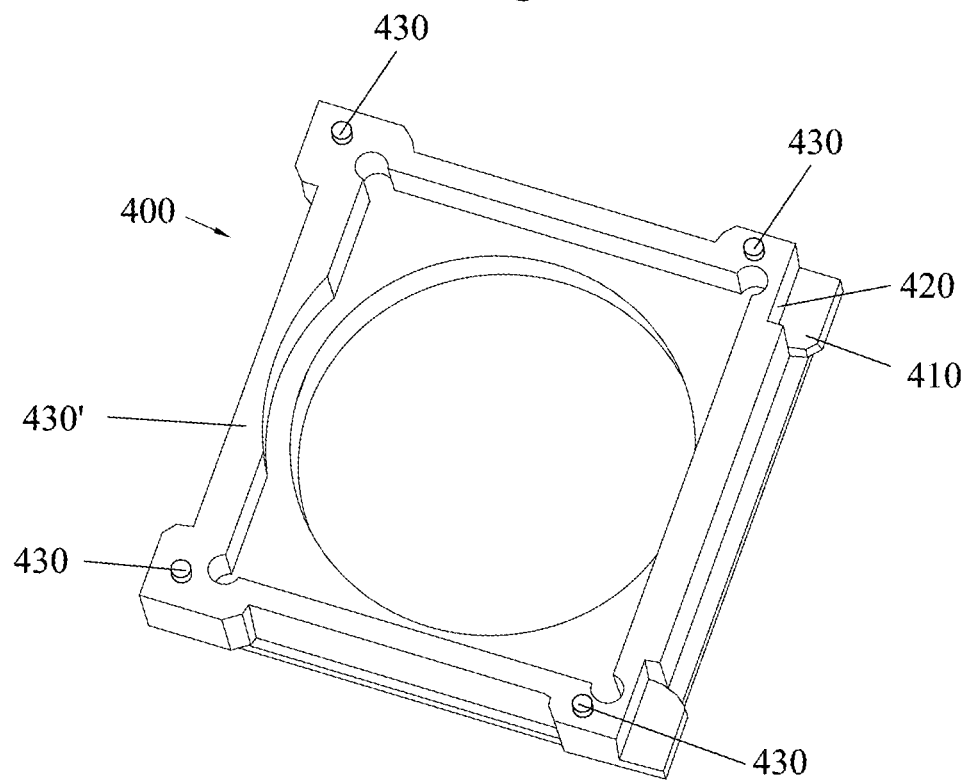
FIG. 5b is a perspective view of the bottom unit of the camera module after hot pressing.

The adjusting method of the back focus length by adjusting the height of the adjustment legs 430 follows. First, a desired focus length is tested by a tester, so that a desired distance (target distance) from the bottom of the adjustment legs 430 to the bottom of the lenses 313 is obtained; then, the center of the lenses 313 is adjusted to be perpendicular to the surface of the CMOS chip 331, and an actual distance between the bottom of the adjustment legs 430 to the bottom of the lenses 313 is measured, therefore a difference between the target distance and the actual distance is obtained; finally, the bottom of the adjustment legs 430 is pressed by an ultrasonic hot pressing machine to trim away a predetermined height (namely the difference mentioned above), so that the actual target distance meets the requirements of assembly. By using an ultrasonic hot pressing machine to adjust the height of the adjustment legs 430, the efficiency is high, and no dust will be generated during trimming, in such a way, the back focus length can be adjusted to ensure the imaging quality. FIGS. 5a and 5b shows the adjustment legs 430 before and after the hot pressing.

Figure 6A:
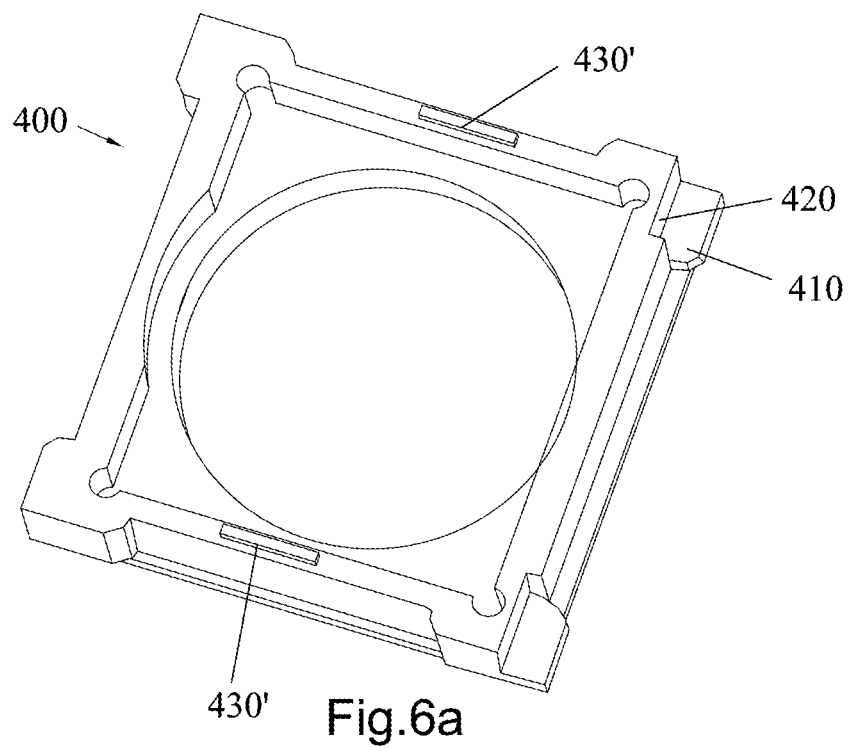
FIGS. 6a-6b show a bottom unit of the camera module according to another embodiment of the present invention, before and after hot pressing.
Figure 6B:
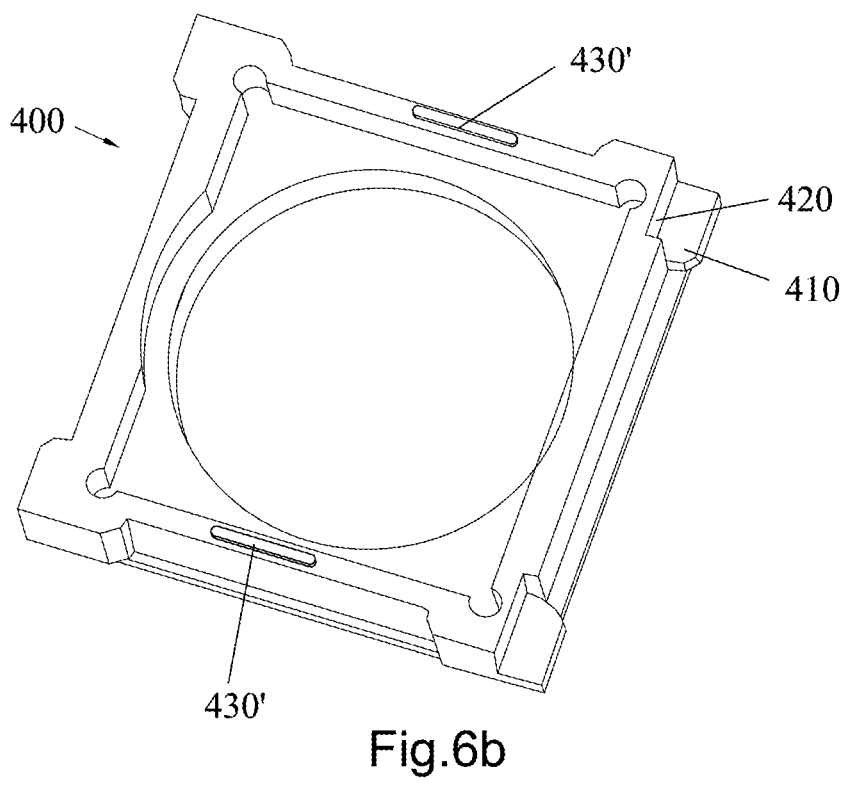
Figure 7A:
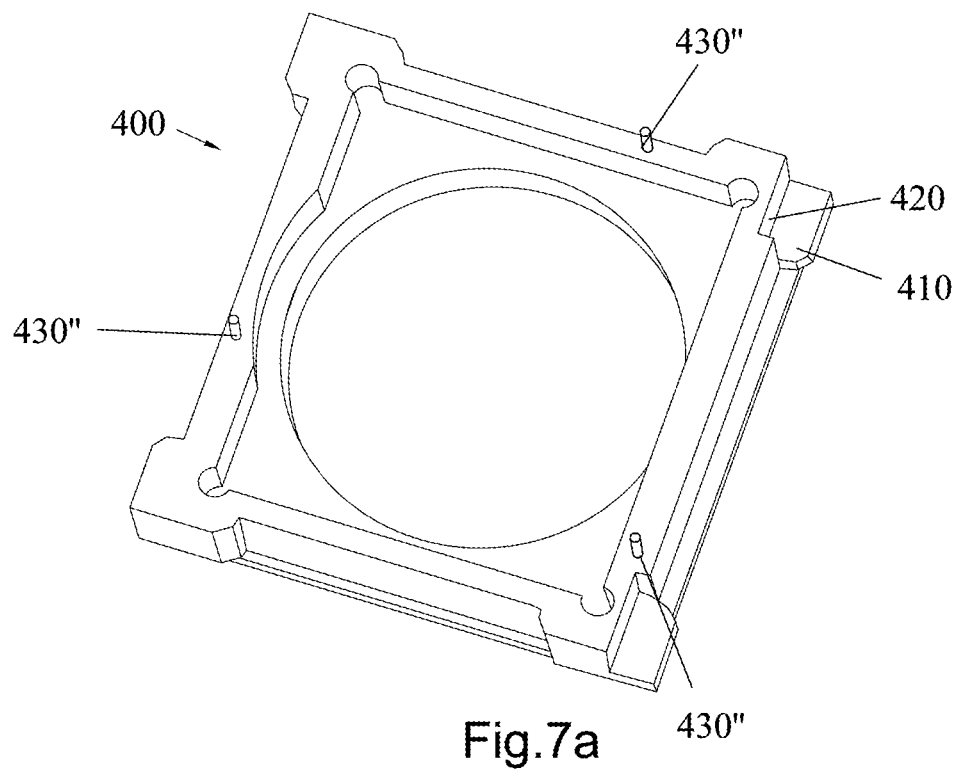
FIGS. 7a-7b show a bottom unit of the camera module according to one more embodiment of the present invention, before and after hot pressing.
Figure 7B:
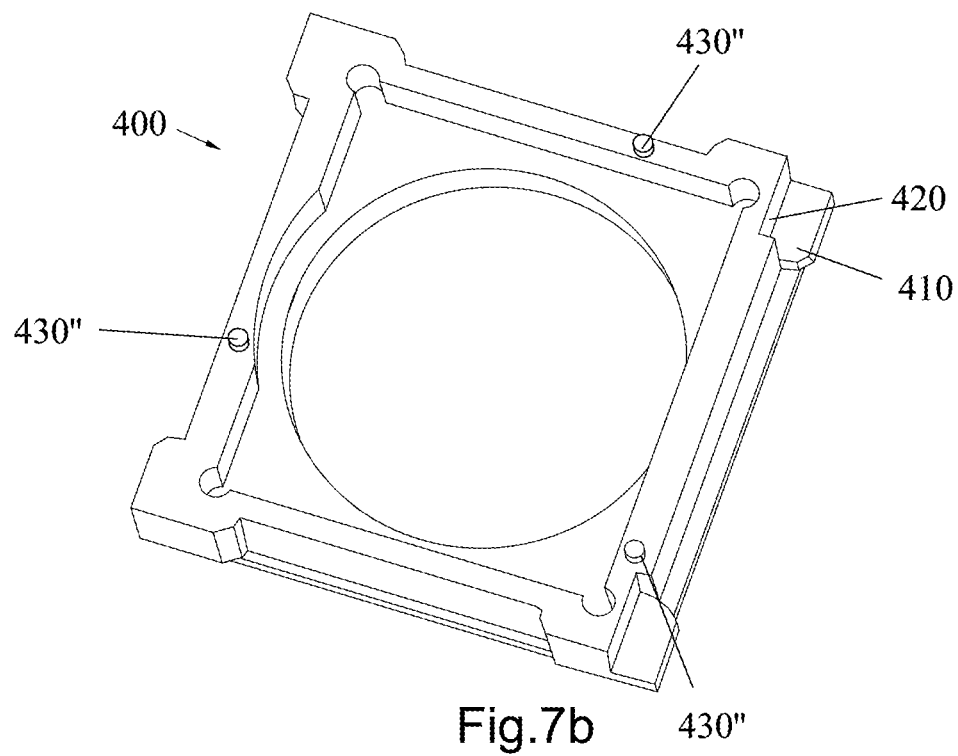

FIGS. 6a-6b and FIGS. 7a-7b show two embodiments of the bottom unit of the camera module respectively. As shown in FIG. 6a, two adjustment legs 430' are formed on the bottom surface of the lower portion 420 of the bottom unit 400, and preferably located at two opposite sides of the bottom surface. After the hot pressing by the ultrasonic hot pressing machine, the legs 430' are presented as strips, as shown in FIG. 6b. FIGS. 7a-7b show three adjustment legs 430" which are embossments and distributed at the bottom surface of the lower portion 420 of the bottom unit 400. These adjustment legs 430" are presented as convex cylindrical after the hot pressing process, as shown in FIG. 7b. In other embodiments, the shapes of the adjustment legs can be other suitable shapes, and the amount is not limited as well.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A camera module, comprising a lens assembly, a voice coil motor assembly for receiving and driving the lens assembly, and an image sensor assembly located below the voice coil motor assembly, wherein
the voice coil motor assembly comprises a bottom unit that is hollow and a color filter supported by the bottom unit,
the color filter, the lens assembly and the image sensor assembly are coaxial,
the bottom unit has an upper portion and a lower portion that are integrated together,
the upper portion is configured to be around the lens assembly, and
the lower portion is configured to be below the lens assembly and to support the color filter,
wherein multiple adjustment legs are provided at a bottom surface, facing the image sensor assembly, of the bottom unit, and a height of the adjustment legs is adjusted to adjust back focal length of the lens assembly, and
wherein the multiple adjustment legs are only two adjustment legs located at two opposite sides of the bottom surface of the bottom unit.

2. The camera module accordingly to claim 1, wherein the image sensor assembly comprises a PCB and an image sensor mounted on the PCB.

3. The camera module accordingly to claim 2, wherein the image sensor assembly is surrounded by the lower portion of the bottom unit, and the color filter is located above the image sensor assembly.

4. The camera module accordingly to claim 1, wherein the adjustment legs and the bottom unit are in an integrated structure.

5. The camera module accordingly to claim 2, wherein the image sensor assembly is a CMOS chip.

6. The camera module accordingly to claim 1, wherein the two adjustment legs are two strips.

7. A camera module, comprising a lens assembly, a voice coil motor assembly for receiving and driving the lens assembly, and an image sensor assembly located below the voice coil motor assembly, wherein
the voice coil motor assembly comprises a bottom unit that is hollow and a color filter supported by the bottom unit,
the color filter, the lens assembly and the image sensor assembly are coaxial,
the bottom unit has an upper portion and a lower portion that are integrated together,
the upper portion is configured to be around the lens assembly, and
the lower portion is configured to be below the lens assembly and to support the color filter,
wherein multiple adjustment legs are provided at a bottom surface, facing the image sensor assembly, of the bottom unit, and a height of the adjustment legs is adjusted to adjust back focal length of the lens assembly, and
wherein the multiple adjustment legs are only three adjustment legs located at three sides of the bottom surface of the bottom unit.

* * * * *